United States Patent
Senechal

(10) Patent No.: US 9,823,368 B2
(45) Date of Patent: Nov. 21, 2017

(54) AVERAGE CLOCK ADJUSTMENT FOR DATA ACQUISITION SYSTEM AND METHOD

(71) Applicant: SERCEL, Carquefou (FR)

(72) Inventor: Emmanuel Senechal, Vaugrigneuse (FR)

(73) Assignee: SERCEL, Carquefou (FR)

( * ) Notice: Subject to any disclaimer, the term of this patent is extended or adjusted under 35 U.S.C. 154(b) by 0 days.

(21) Appl. No.: 14/968,991

(22) Filed: Dec. 15, 2015

(65) Prior Publication Data

US 2017/0168180 A1 Jun. 15, 2017

(51) Int. Cl.
G01V 1/32 (2006.01)
H03M 1/12 (2006.01)
G01V 1/24 (2006.01)
H03K 5/00 (2006.01)

(52) U.S. Cl.
CPC .......... *G01V 1/32* (2013.01); *G01V 1/24* (2013.01); *H03K 5/00006* (2013.01); *H03M 1/12* (2013.01); *G01V 2200/12* (2013.01)

(58) Field of Classification Search
CPC .... G01V 1/00; G01V 1/32; G06F 1/00; G06F 1/08; G06F 1/324; H03K 3/00; H03K 3/72; H03K 5/00; H03K 5/00006; H03K 7/00; H03K 7/06; H03M 1/00; H03M 1/12
USPC ........................................................ 327/114
See application file for complete search history.

(56) References Cited

U.S. PATENT DOCUMENTS

| | | |
|---|---|---|
| 8,260,580 B2 | 9/2012 | Laine |
| 2007/0276891 A1 | 11/2007 | Warner et al. |
| 2010/0198561 A1* | 8/2010 | Laine ............. G01V 1/32 |
| | | 702/189 |

FOREIGN PATENT DOCUMENTS

WO 2015/038018 A2 3/2015

OTHER PUBLICATIONS

International Search Report in corresponding International Application No. PCT/IB2016/001939 dated Mar. 23, 2017.

* cited by examiner

*Primary Examiner* — Lincoln Donovan
*Assistant Examiner* — David Mattison
(74) *Attorney, Agent, or Firm* — Patent Portfolio Builders PLLC

(57) ABSTRACT

A system and method for adjusting a clock signal of a seismic data acquisition system. The system includes a data acquisition device having an oscillator that generates a clock signal; a clock adjustment module that receives a time reference signal and the clock signal and outputs an adjusted clock signal; and an analog-to-digital convertor configured to transform analog data into digital data having a sampling rate ($F_{DATA}$). A sampling frequency ($f_{ADC}$) of the analog-to-digital convertor is selected to be at least twice the sampling rate ($F_{DATA}$).

20 Claims, 9 Drawing Sheets

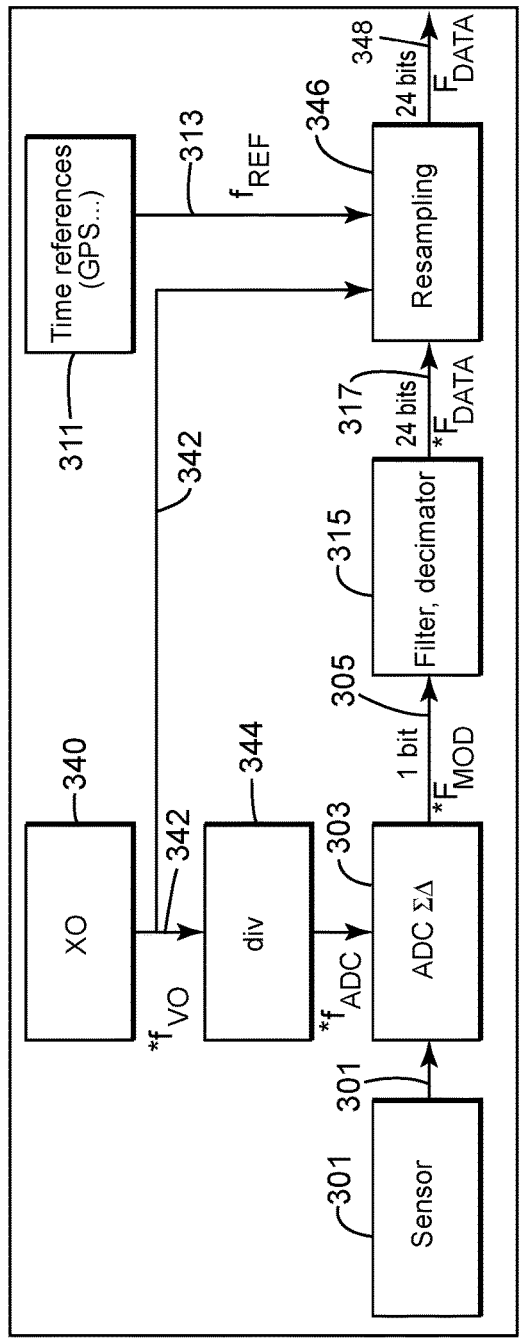
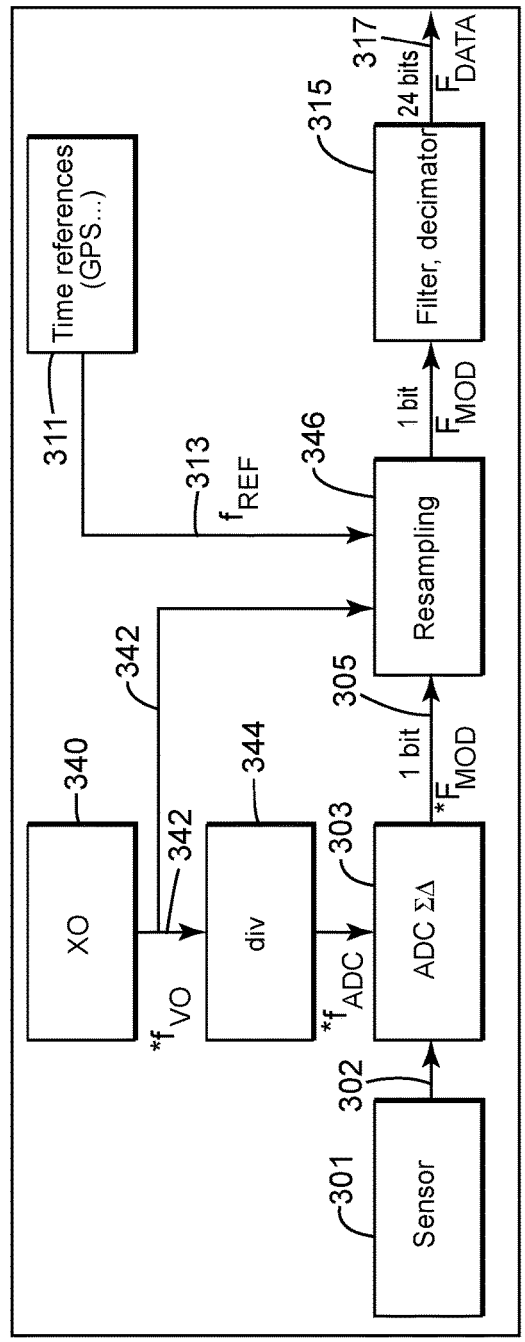
FIG. 3A
FIG. 3B

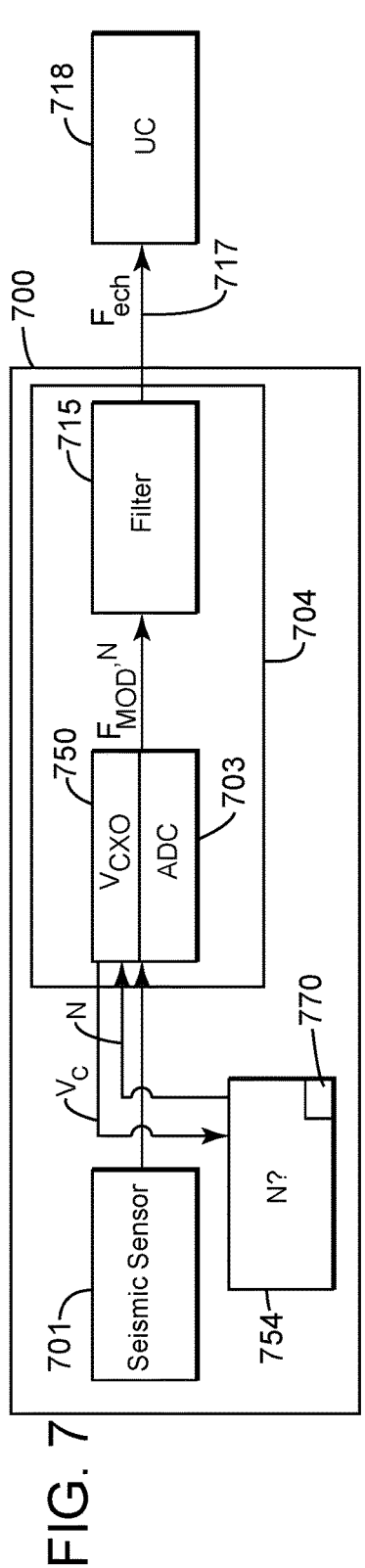

AVERAGE CLOCK ADJUSTMENT FOR DATA ACQUISITION SYSTEM AND METHOD

BACKGROUND

Technical Field

Embodiments of the subject matter disclosed herein generally relate to methods and systems for adjusting a clock associated with a data acquisition device and, more particularly, to mechanisms and techniques for correcting a clock frequency of the data acquisition device at certain time intervals, the data being preferably seismic data.

Discussion of the Background

Seismic data acquisition and processing may be used to generate a profile (image) of geophysical structures under the ground (subsurface). While this profile does not provide an accurate location for oil and gas reservoirs, it suggests, to those trained in the field, the presence or absence of such reservoirs. Thus, providing a high-resolution image of the subsurface is important, for example, to those who need to determine where the oil and gas reservoirs are located.

The seismic data is collected under various conditions, for example, (i) in a marine environment, (ii) above ground, which is exposed to daily temperature changes, or (iii) inside a well, where the temperature and pressure are very high. Irrespective of the ambient conditions under which the seismic data is collected, it is widespread to collect analog data with analog sensors, e.g., geophones, hydrophones, accelerometers, etc. However, for processing the collected analog seismic data, it has to be transformed from the analog domain to the digital domain. There are various analog-to-digital devices and corresponding schemes for this transformation, as now discussed.

FIG. 1 shows a seismic data acquisition device 100 that includes a seismic sensor 101, which acquires the analog seismic data. In one case, seismic sensor 101 is not part of device 100, i.e., sensor 101 may reside outside device 101. For simplicity, the seismic sensor 101 is considered to be part of the device 100 herein, but those skilled in the art would understand that this is merely one possibility. Seismic data acquisition device 100 also includes an analog-to-digital convertor (ADC) 103, which can be associated with a ΔΣ modulator. These ADC are well known in the art and for this reason, a full description of this device is not provided herein. An ADC is known to generate a signal 105 characterized by a data flow (e.g., of 1 bit, or bitstream, for a ΔΣ ADC) and frequency $F_{MOD}$, which is directly linked to a signal frequency $f_{ADC}$ of the clock signal 107. Signal 105 is synchronous therewith with clock signal 107. For the seismic environment, it is customary to have $F_{MOD}=f_{ADC}$ or $F_{MOD}=f_{ADC}/2$, or $F_{MOD}=f_{ADC}/4$.

The seismic data acquisition device 100 also includes the ADC clock generator module 109, which may include a clock of an oscillator type (XO) and its monitoring/controlling circuits. These circuits allow to generate the clock signal 107 as required by ADC 103. The ADC clock generator module 109 may be connected to a time reference module 111 (which provides a reference time signal 113 having a frequency $f_{REF}$), and the ADC clock generator module 109 produces a desired clock signal with a frequency $K \times f_{REF}$ (the frequency is a multiple of the reference signal) and synchronous therewith, which is used for sampling an analog signal 102 generated by the analog sensor 101. The frequency $f_{REF}$ of the reference time signal is also used for aligning the entire system 100.

Signal 105, generated by the ADC, is sent to a decimation filter 115 for reducing the amount of data (eliminating certain frequencies, i.e., decimating the signal, which is preceded by dealiasing). The decimation filter 115 may also remove some noise. The decimation filter 115 may include a digital signal processing (DSP), or a FGPA (field-programmable gate array). Because these elements are well known in the art, their description is omitted herein.

The decimation filter 115 rejects quantifying noise out a usable band, while lowering the sampling rate to $F_{DATA}$, and increasing the resolution of the signal (e.g., to 24 bits instead of 1 bit). The signal output 117 (having sampling rate of $F_{DATA}$) from the decimation filter 115 may be sent to a central unit 120 for seismic processing.

For the particular case of seismic processing, the ADC may generate an acquisition flow having a frequency $F_{MOD}=1024$ k samples/s of low resolution (1 bit) and the decimation filter 115 may provide a resolution of 24 bits with a maximum final data rate $F_{DATA}=4000$ samples/s.

However, the configuration discussed with regard to FIG. 1 requires either expensive oscillators or demanding processing, which is undesired in the seismic field. Thus, there is a need to improve a seismic data acquisition system so that the plural acquisition devices, which make up the system, are time synchronized, include inexpensive hardware and are not demanding high-end processing resources.

SUMMARY OF THE INVENTION

According to an aspect of the invention, a mechanism for adjusting a clock signal for a seismic data acquisition system performs a time adjustment every N cycle so that in average, the adjusted clock signal is time synchronized with a time reference signal.

In one embodiment, there is a seismic data acquisition device having an oscillator that generates a clock signal; a clock adjustment module that receives a time reference signal and the clock signal and outputs an adjusted clock signal; and an analog-to-digital convertor configured to transform analog data into digital data having a sampling rate ($F_{DATA}$). A sampling frequency ($f_{ADC}$) of the analog-to-digital convertor is selected to be at least twice the sampling rate ($F_{DATA}$). The clock adjustment module is configured to adjust the clock signal every $N^{th}$ period, so that the adjusted clock signal is, over the N periods, as long as a desired clock signal, the desired clock signal having a frequency ($K \times f_{REF}$) that is a multiple of a frequency ($f_{REF}$) of the time reference signal. A frequency ($F_{XO}/D$) of the clock signal divided by a divisor (D) is differing from the frequency ($K \times f_{REF}$) of the desired clock signal with more than the sampling rate ($F_{DATA}$).

According to another embodiment, there is a seismic data acquisition device that includes an oscillator that generates a clock signal; a clock adjustment module that receives a time reference signal and the clock signal and outputs an adjusted clock signal; and an analog-to-digital convertor configured to transform analog seismic data into digital data at a data sampling rate ($F_{DATA}$) adapted for seismic data, based on the adjusted clock signal, the sampling frequency of the analog-to-digital converter being greater than twice the data sampling rate. The clock adjustment module increases or decreases the $N^{th}$ period of the clock signal so that the adjusted clock signal is, over the N periods, as long as a desired clock signal, the desired clock signal having a frequency ($K \times f_{REF}$) that is a multiple of a frequency ($f_{REF}$)

of the time reference signal and synchronized therewith. The clock signal generated by the oscillator is differing from the desired clock signal with more than the sampling rate ($F_{DATA}$).

According to yet another embodiment, there is a method for digitizing analog seismic data with a desired clock signal. The method includes receiving the analog seismic data; generating a clock signal differing from said desired clock signal with an oscillator; adjusting the clock signal every $N^{th}$ period, with a clock adjustment module, so that an adjusted clock signal is, over the N periods, as long as a desired clock signal; and digitizing the analog seismic data with an analog-to-digital convertor based on the adjusted clock signal, a sampling frequency of the analog-to-digital converter being greater than twice a useful seismic bandwidth.

According to still another exemplary embodiment, there is a computer readable medium including computer executable instructions, wherein the instructions, when executed by a processor, implement steps for digitizing analog seismic data, as discussed above.

BRIEF DESCRIPTION OF THE DRAWINGS

For a more complete understanding of the present invention, reference is now made to the following descriptions taken in conjunction with the accompanying drawings, in which:

FIG. 3A illustrates a seismic data acquisition system using an XO module for generating a clock signal;

FIG. 3B illustrates another seismic data acquisition system using a time synchronized clock generation module;

FIG. 7 illustrates a well tool that has a clock adjustment module;

FIG. 8 illustrates a well tool that has a clock adjustment module and a switching module;

DETAILED DESCRIPTION OF THE INVENTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to a seismic data acquisition system that is deployed in a well for collecting the seismic data. However, the embodiments to be discussed next are not limited to well collection data, they may be applied to surface collection data, marine collection data or other fields in which the data is collected from multiple device that need to be time synchronized.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1:
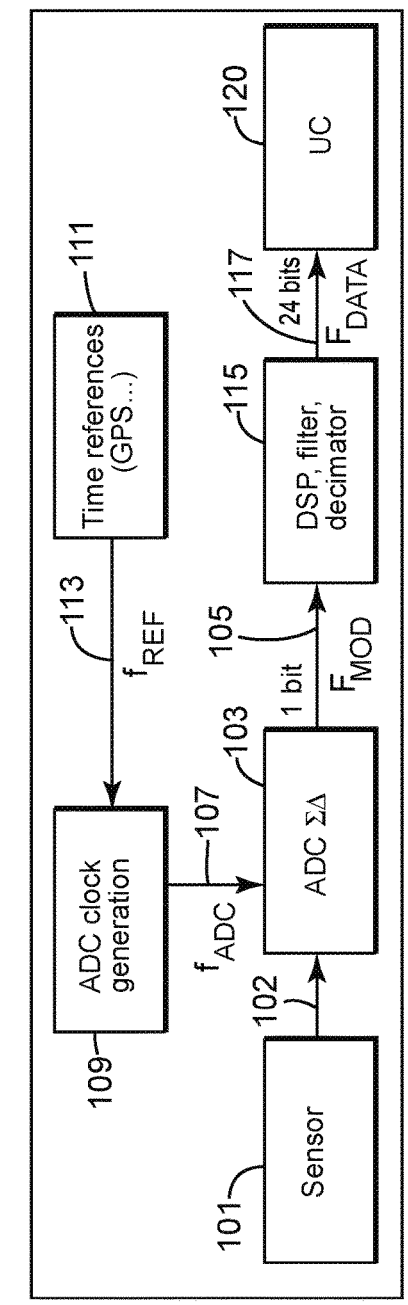
FIG. 1 illustrates a seismic data acquisition system using a time synchronized clock generation module.
Figure 2:
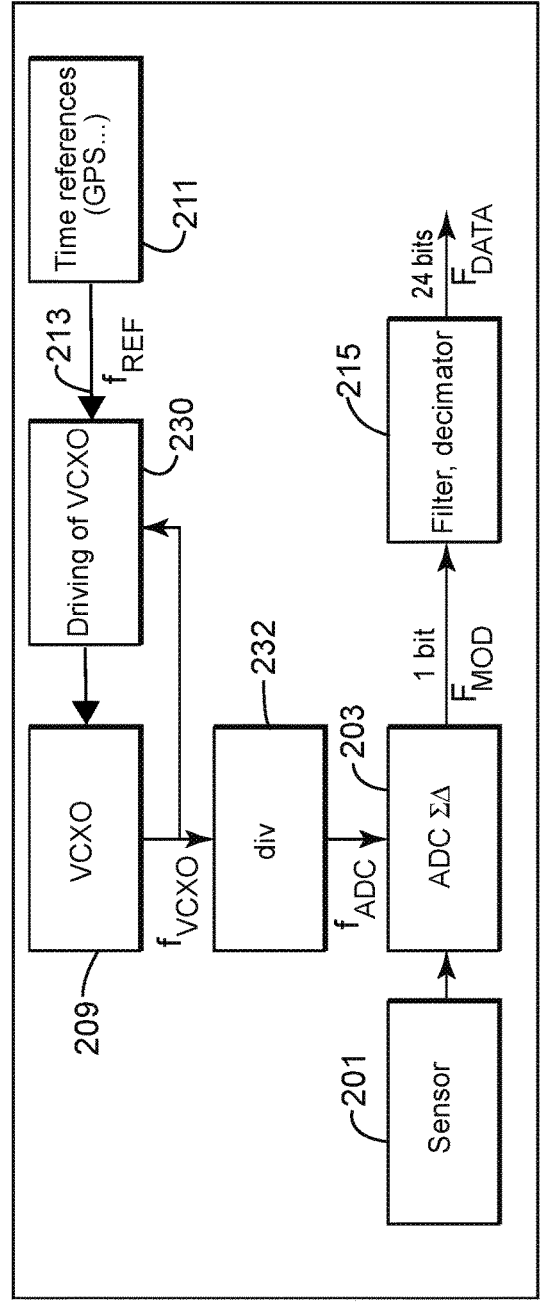
FIG. 2 illustrates a seismic data acquisition system using a VCXO module for generating a clock signal.

If the ADC clock generator of FIG. 1 includes a voltage controlled crystal oscillator (VCXO) 209, as illustrated in FIG. 2, the seismic data acquisition device 200 also includes a driving module 230 for driving the VCXO and a frequency divider module 232 that divides the frequency $f_{VCXO}$ emitted by VCXO 209 with a given number D to generate the $f_{ADC}$ signal. A VCXO can generate any frequency around its nominal frequency $f_{VCXO}$. The complete range allowed by the VXCO is called "pulling range," and this range is expressed in parts per million (ppm), where 1 ppm=0.0001%. The range for the VXCO is typically about hundreds of ppm (e.g., 600 ppm). Thus, when the VCXO is correctly driven, it can generate any frequency within the range: [$f_{VCXO}$−Pulling_range/2; $f_{VCXO}$+Pulling_range/2].

Because the VCXO is time synchronized (enslaved) with the time reference module 211 (e.g., GPS system), the VCXO can continuously generate a signal with frequency $f_{VCXO}$ (e.g., 24.576 MHz) synchronous with the time reference $f_{REF}$. In this case, as illustrated in FIG. 2, $f_{ADC}$ is obtained by simply dividing the VCXO's frequency $f_{VCXO}$ with D, and the whole seismic acquisition chain is synchronous with the time reference signal 213.

However, the central frequency of the VCXO can evolve with the ambient temperature and/or aging of its components. For example, for a VCXO at 25° C., it can generate any frequency within the range [24.572 MHz; 24.587 MHz], i.e., 24.580 MHz+/−300 ppm. If the temperature is increasing to 210° C., as is the case in a well, the VCXO can only generate frequencies within the range [24.577 MHz; 24.592 MHz], i.e., 24.585 MHz+/−300 ppm. Thus, a disadvantage of such a configuration is that it cannot work at the desired frequency of 24.576 MHz in a hot environment.

For a well seismic acquisition system, in which the temperature may be above 200-215° C., reaching is some cases a temperature in the range of 250 to 280° C., because of its hardware limitation, a VCXO might not be able to fulfill the requirements of the wanted frequency for the whole temperature range (typically from 0° C. to 225° C.) and presents a shift which might exceed 150 ppm.

An option for fixing this problem is to add a second VCXO to the embodiment of FIG. 2, with different characteristics than the first VCXO 209. Each of the first and second VCXO has its own optimal working temperature range, based on where its frequency is the most stable. The ADC 203 is then associated with a selection unit for receiving the time signal $f_{ADC}$ from one of the first or the second VCXO, based on ambient temperature. Such selection unit may be a processor connected to a temperature unit and a storage device. The storage device stores information about the first and second VCXO. The processor in the selection unit, based on the measured temperature received from the temperature unit (e.g., a temperature sensor), determines which VCXO output should be used by divided module 232.

However, VCXO are relatively expensive, in particular for small series, in particular for the highest temperature range of the well seismic acquisition. This drawback would of course be considerably increased for the option with two VCXOs.

Other configurations used in the seismic field are illustrated in FIGS. 3A and 3B. FIG. 3A shows a seismic data acquisition system 300 that includes an XO oscillator 340 that is configured to generate a clock signal 342 having a frequency $*f_{XO}$. Note that any signal that has a star "*" next to a corresponding frequency "f" in the drawings indicates that the frequency of that signal is not synchronous with the time reference signal $f_{REF}$. Clock signal 342 is divided by an appropriate number D in a frequency divider module 344 to generate the $*f_{ADC}$ signal for the ADC 303. Clock signal (or a sub-multiple thereof) 342 is also supplied to a resampling unit 346, located after the decimation filter 315. Resampling unit 346 compares the clock signal $*f_{XO}$ from the XO oscillator with the reference signal 313 from the time reference unit, and, if there is a drift, it resamples output signal 317 to output resampled signal 348. However, this solution requires intensive computational resources and a long time as the resampling is applied to signal 317 having 24 bits.

An improvement of the embodiment illustrated in FIG. 3A is shown in FIG. 3B, in which the resampling unit 346 is located between ΔΣ ADC 303 and decimation filter 315 so that the resampling is performed on the 1 bit signal 305. Although the processing cost is lower for this embodiment than the embodiment of FIG. 3A, the overall calculations are still relatively complex. Further, this embodiment necessitates calculations directly on the bitstream 305 generated by the ADC. However, numerous existing seismic acquisition devices house both the ΣΔ modulator and the decimation filter in the same enclosure and, thus, there is no possibility to extract the bitstream 305.

Embodiments discussed above suffer from the following problems. If the XO oscillator is used, it has the advantage that the cost is low and it can work for high temperatures (e.g., higher than 225° C.). The disadvantage of this oscillator is that the generated frequency is fixed and thus, it necessitates a numerical treatment for time synchronizing the acquired seismic data. If the VCXO oscillator is used, its frequency can be controlled and thus, it is easier to synchronize its frequency with the time reference signal. However, such an oscillator is more expensive, will not achieve the same performance as required above 200° C., and its frequency is difficult to control over the desired temperature range.

Therefore, according to another embodiment, there is a configuration of a seismic data acquisition device that does not require data processing (e.g., no data resampling is necessary), works on the ADC clock instead of working on the seismic data, and may be used with an XO or VCXO oscillator.

Figure 4:
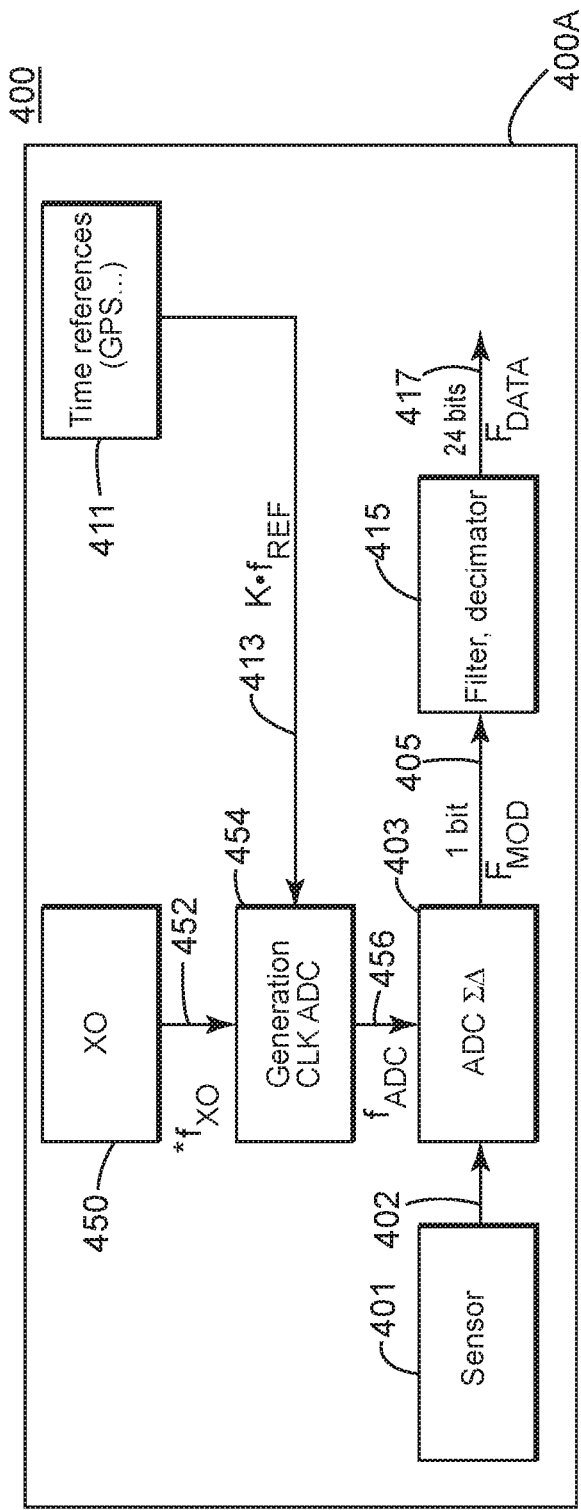
FIG. 4 illustrates a seismic data acquisition system that periodically adjusts a clock signal to be time synchronized with a reference time signal.

More specifically, as illustrated in FIG. 4, a seismic data acquisition device 400 includes an oscillator 450 that generates a clock signal 452 having a frequency $*f_{XO}$. For exemplification purposes, the oscillator shown in FIG. 4 is an XO oscillator. Note that this clock signal is not time synchronized with the time reference signal 413 (which may have a frequency given by multiplying $f_{REF}$ by a number K) generated by time reference module 411. Device 400 may have a housing 400A that includes all these elements.

Instead of resampling the data as discussed above with regard to FIGS. 3A and 3B, the present embodiment uses a new module 454, called herein a clock adjustment module, that adjusts from time to time the frequency of the clock signal 452 to be synchronous with the time reference signal 413 and correspond to the desired clock signal frequency $K \cdot f_{REF}$. This means, that there is no seismic data processing as in the embodiments of FIGS. 3A and 3B.

Different from the embodiment illustrated in FIG. 2, the clock adjustment mechanism 454 does not correct/adjust the clock signal 452 continuously, but only after a certain number N of time periods. This certain number N of time periods is calculated, in one embodiment, by the clock adjustment mechanism 454 as now discussed. In other words, the clock adjustment mechanism 454 generates an adjusted clock signal 456, for the ADC 403, and the adjusted clock signal 456 is in average synchronous with the desired ADC clock signal, considered to be synchronous with the time reference signal 413 for each cycle. This concept of average synchronicity can be understood if the time lengths of the desired ADC signal and actual ADC signal 456 are considered over the number N of time periods. In other words, the adjusted clock signal 456 (or actual ADC signal) has the same duration as the desired ADC clock signal over the N time periods. This is possible because the clock adjustment mechanism 454 introduces an adjustment R to the clock signal 452 to make it have the same length as the desired ADC clock signal. The adjustment R may be positive or negative, i.e., it may increase or decrease the length of the clock signal 452 over the N periods. With such a modification, it would be advisable if not required that filter 415 before the ADC 403 would be an analogic dealiasing filter to avoid rejection of the signals outside the base bandwidth.

Figure 5:
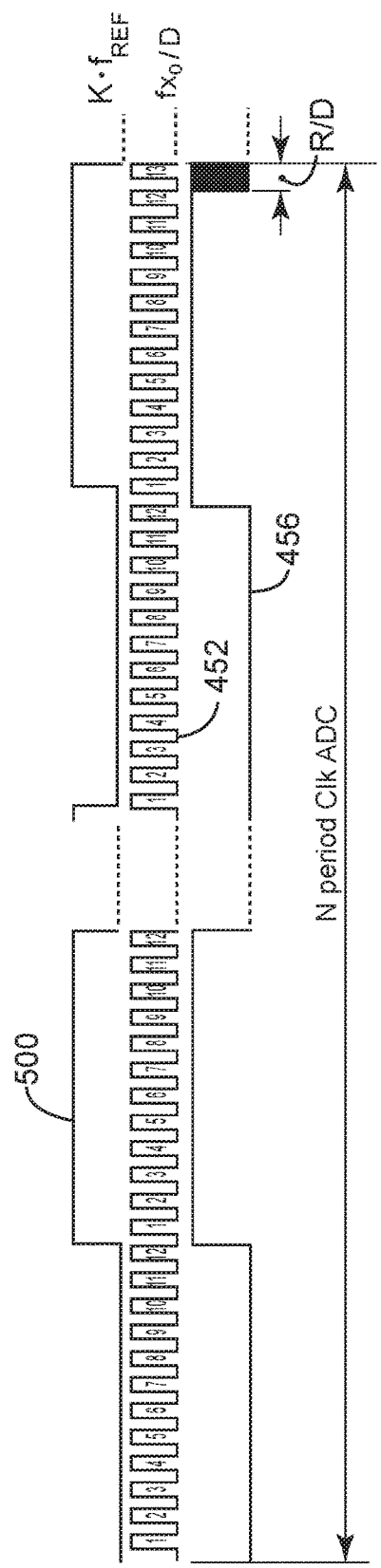
FIG. 5 illustrates a gap between a desired ADC signal and an actual ADC signal.

FIG. 5 illustrates the desired ADC signal 500 to be provided to the ADC 403. The desired ADC clock signal 500 is time synchronized with the time reference signal 413. However, in real implementations, the XO 450 cannot generate such a precise signal. The clock signal 452 generated by the XO is also illustrated in FIG. 5. A comparison of the time length of the actual ADC signal 452 (not adjusted) to the time length of the desired ADC signal 500 shows a time mismatch between the two signals (see FIG. 5). To compensate for this time mismatch, the clock adjustment mechanism 454 calculates a gap between the two signals and adjusts only the $N^{th}$ period of the clock signal 452 with that gap to generate the adjusted clock signal 456. In other words, the clock signal 452 and the adjusted clock signal 456 are time synchronized (taking into account the divisor D) for the first N−1 periods and different over the $N^{th}$ period. The gap is shown in FIG. 5 as the ratio between R and D, where R is the mismatch between the actual ADC signal 456 and the desired ADC signal 500, and D is an integer with which the clock signal 452's frequency $*f_{XO}$ is divided to obtain the actual $f_{ADC}$ frequency. For the example discussed herein, D is 24. However, other values for D may be used.

In one embodiment, when seismic data is collected, the clock signal 452's frequency is 24.588 MHz, which is larger than the desired ADC signal 500, which is 24.576 MHz. If D=24, the frequency of the adjusted clock signal 456 is 1.0245 MHz, instead of the desired 1.024 MHz. Thus, for this specific case, R is given by 1/24.588 MHz=41 ns and R/D is a little bit less than 2 ns.

Figure 6:
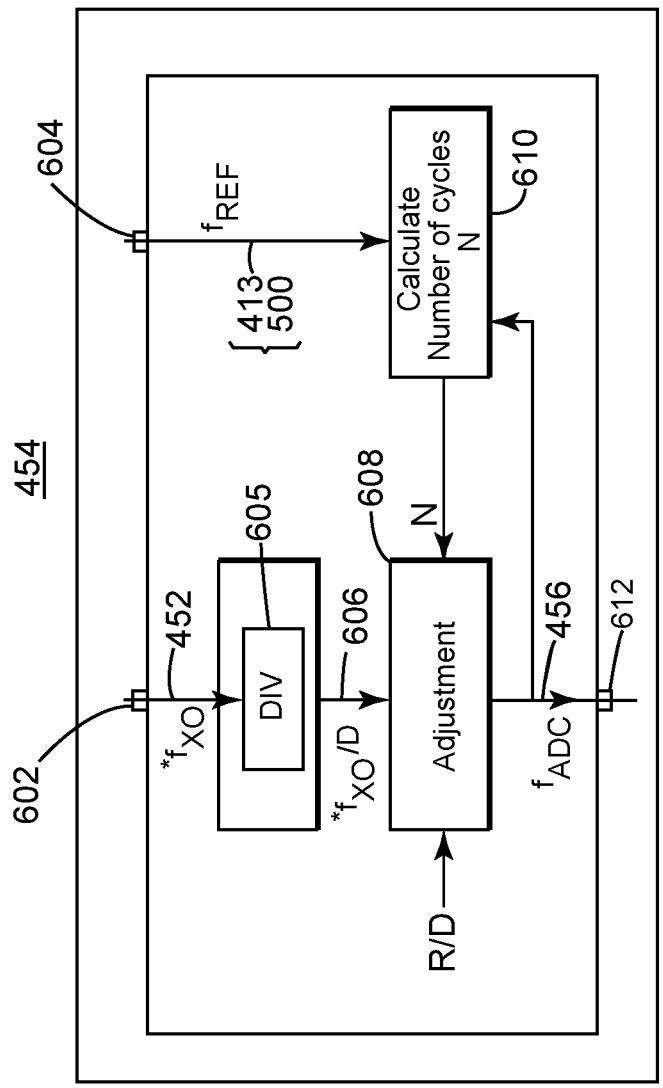
FIG. 6 illustrates a clock adjustment module that adjusts an actual ADC signal.

One possible implementation of the clock adjustment mechanism 454 is illustrated in FIG. 6. Clock adjustment mechanism 454 has two inputs 602 and 604, at which the clock signal 452 and either the time reference signal 413 or the desired clock signal 500 (since they are synchronous) are received. A frequency divider module 605 divides the clock signal 452 with the desired number D to obtain ADC clock signal 606. This signal is supplied to adjustment module 608 for adjusting the frequency of the ADC signal clock 606. The output of the adjustment module 608 is the adjusted clock signal 456, which has the same frequency, over N periods, as the desired signal 500. Adjustment module 608, which may be implemented in hardware, software or a combination of the two, also receives as input the adjustment R, divisor D, and the number of cycles N at which the ADC signal 606 should be adjusted. In one application, adjustment clock modulator 608 includes a processor and a memory. In another application, adjustment modulator 608 is a software routine that runs on an existing processor.

The number of cycles N is calculated at module 610. Module 610, similar to module 608, can be implemented in hardware, software or a combination of the two. Module 610 calculates the number of cycles N by comparing the frequency $f_{ADC}$ of adjusted clock signal 456 with the frequency $K \cdot f_{REF}$ of desired clock signal 500. R is selected to be, for example, $1/*f_{XO}$, which in one application is the minimum correction time for a given clock frequency, and N is calculated so that, $[N \times D/f_{XO} + R = N \times D/f_{XO}']$, namely with a frequency shift in ppm of $10^6/(D \times N)$. The number of cycles N may also be calculated by comparing not the frequency $f_{ADC}$, but rather the frequency $*f_{XO}$ or $*f_{XO}/D$. Output adjusted clock signal 456 is then provided at output 612, which is connected to ADC 403 for sampling the analog seismic data. In this way, there is no need for data resampling.

The adjustment of the clock signal may be implemented in the clock adjustment module in various ways. For example, it is possible to control two elements: the adjustment R (its length or duration of adjustment) and the number of cycles N (frequency of adjustment). If the hardware support for the clock adjustment module is a field-programmable gate array (FPGA) having elements that operate at a frequency $f_{FPGA}$, R has a minimum duration imposed by the components of the FPGA.

In one implementation, the value of R is taken to be $1/f_{FPGA}$, while the value of N can vary in time. However, those skilled in the art would know that it is possible to keep N constant and vary the value of R, or to vary both R and N.

As noted above, for this embodiment, the number of periods N is calculated by determining the shift between the clock signal and time reference signal. However, in practice, the clock signal $f_{XO}$ is relatively stable (at a given temperature) and possible modifications for N are limited (e.g., around every second). In one embodiment, it is possible to calculate N every 10 s. Too frequent modifications of N may lead to an unstable time synchronization or generate parasite noise. This leads to a selection to be made for the shift between both clock signals.

Thus, in one embodiment, it is possible to adjust the ADC clock signal 606 every $N_1$ cycles for the first second. After the first second, the number of periods N is recalculated, and then, it is possible to adjust the ADC clock 606 every $N_2$ cycles for the next second, and so on. Of course, the one second time period for adjusting the value of N is exemplary and those skilled in the art would understand that other values can be used.

For this adjustment method to be reliable and efficient and according to the invention, specific parameters are chosen for the components of the data acquisition system. Indeed, the following considerations should be taken into account when determining the number of periods N and how often to update the calculation of N. Note that the two conditions discussed next may be used independent of each other or together.

I. Spectrum folding, a known aliasing phenomena in signal processing, may be present in the instant case when inserting a perturbation (R) in the sampling clock, every N periods. In terms of frequencies, the acquisition clock signal is now composed of two main elements: one having the frequency $f_{ADC}$ and the other one having the frequency $f_{REP} = f_{ADC}/N$, where $f_{REP}$ describes the insertion of the adjustment R every N periods. The spectrum folding may be caused by each of these two components. For this phenomena to not be visible within the band of interest (i.e., in useful bandwidth BW containing the seismic signals that are desired to be observed, e.g., with $BW=F_{DATA}/2$ around 2 kHz), N needs to be small enough so that it is possible to reject $f_{REP}$ far (above) the usable band ($f_{REP} > 4000$ Hz). This condition can be also expressed as follows: a sampling frequency ($f_{ADC}$) of the analog-to-digital convertor is selected to be at least twice the sampling rate ($F_{DATA}$).

II. Because elements of the system have a limited tolerance regarding their clock (e.g., a component has a maximum work frequency, or the capacity of two distinct systems to communicate together is far easier if the work frequencies are near each other), this frequency needs to stay relatively near the ideal frequency, which can be achieved if N is big enough. This means that the shift between the clock signal and the desired clock signal (or time reference signal) is chosen to be greater than 150 ppm or 160 ppm, preferably more than 169 ppm for embodiments related to seismic data. In one application, a frequency $F_{XO}$ of the oscillator clock signal, after being divided with divisor D, differs from a frequency $K \cdot f_{REF}$ of the desired clock signal 500 with more than the data sampling's rate $F_{DATA}$.

The oscillator's frequency also plays a role in the granularity of the system, i.e., the capacity to apply small variations to the adjusted clock signal (or ADC clock frequency), namely, the smaller the frequency variations, the more it is possible to "fit" the adjusted clock signal 456 to the ideal clock 500, resulting in a better time synchronization.

Introducing adjustment R every N cycle to obtain the adjusted clock signal 456 of frequency $f_{ADC}$ corresponds to a variation of frequency of: $R/(N \cdot 1/f_{ADC})$, i.e. $R \cdot f_{ADC}/N$, with R and $f_{ADC}$ constant. This means that the larger the N, the higher the variation of N, i.e., $\delta_f(N)$ or $\delta_{PPM}$ (in absolute) as the derivative of $1/N$ is $1/N^2$. This means that N should not be too big.

These competing considerations that require N to be not too small but also not too large, determine the boundaries for the values of N. These limitations to N correspond to constraints on the device itself, in particular, on the sampling frequency $F_{MOD}$, or $F_{DATA}$, relative to the useful bandwidth BW of data, and on the clock signal $*f_{XO}$ 452 relative to the desired clock signal $K \cdot f_{REF}$ 500.

To illustrate the boundaries of N for a specific seismic case, consider the following example. The frequency of the clock signal 452 is $*f_{XO} \sim 24.576$ MHz, and the frequency of the adjusted clock signal 456 is $f_{ADC}=1.024$ MHz. The adjustment R is given by $R=1/f_{FPGA}=1/f_{XO}$. The division factor D should be as high as possible, like equal to 24, and variation of the frequency of the adjusted clock signal is given by: $\delta_{PPM}=R \cdot f_{ADC}/N=f_{ADC}/(N \cdot f_{XO})=1/(24N)$ if $*f_{XO}/f_{ADC}$ is considered to be 24.

Because the frequency $F_{DATA}$ of the seismic data flow signal 417 has a maximum of 4000 samples/sec, it means that the bandwidth of interest is limited to $BW=2$ kHz by the Nyquist limit (and even less depending on the filter). If the folding discussed above is desired to be avoided, then it is recommended the following condition for the frequency $f_{REP}=f_{ADC}/N >> 4$ kHz$=2 \cdot BW$, which means that $N << f_{ADC}/4$ kHz, e.g., N<<256, which corresponds to folding of BW around $f_{REP}$ and not visible in the band of interest BW.

According to an embodiment, a choice for the sampling rate of ADC is made with regard to the sampling data rate $F_{DATA}$ for fulfilling the above condition. This choice involves an over-sampling of the ADC, with the sampling frequency $f_{ADC}$ of the ADC being at least twice, or preferably 32 times, the data sampling rate $F_{DATA}$, i.e., $f_{ADC} \geq 2^5 \cdot F_{DATA}$. This choice allows filtering before decimation and the noise to be out of the bandwidth BW. In particular for seismic acquisition, the system according to this embodiment preferably uses ADCs known as "oversampling ADCs", for which the sampling frequency is far above the requested parameter, e.g., $f_{ADC} > 256 \cdot F_{DATA}$. Such oversampling ADCs are, e.g., discrete time sigma-delta ADC or switched capacitors.

Regarding the oscillator's frequency phenomena discussed above, i.e., for ensuring good communication between different systems, it is desired to limit the shift $*f_{XO} - f_{ADC(ideal)}$ to 400 ppm. This means that $\delta_{PPM} = R*f_{ADC}/N < 400$ ppm, which implies that $1/(24N) < 400$ ppm, i.e., $N > 104.2$. This means that the boundaries for N are about 100 and 300 for this specific seismic example. Those skilled in the art would understand that these numbers are exemplary and specifically apply to the embodiment discussed in FIG. 4, but other devices would have different characteristics, and thus, different boundary values for N, in particular $N \geq F_{DATA}$.

In general, the upper and lower limits that bound N are determined as follows. For the upper value $N_{max}$, folding is outside the useful band when $f_{REP} > 4000$ Hz (this value is device specific), for the seismic data case. For the lower value $N_{min}$, the granularity should be below 400 ppm (this value is also device specific and/or a matter of choice for the device's operator). These limits may be changed or adjusted for a specific situation. The examples noted herein are appropriate for a seismic acquisition system. However other applications are also envisioned, wherein similar choices are made.

The embodiments discussed above refer to enlarging a high state of the clock signal (see FIG. 5). However, it is possible to enlarge a low state of the clock signal. Also, the above discussed embodiments have illustrated the case of enlarging the clock signal. This is not necessary the rule as the method may be applied to reduce a low or high state of the clock signal (e.g., if oscillator frequency is lower than ideal frequency).

The above embodiments have been discussed with the assumption that the clock signal is generated by an XO oscillator. The same method applies if the clock signal is generated by a VCXO or other types of oscillators. In particular, for a VCXO, this fixed or semi-fixed determination of N works well since the VCXO component can take care on the fineness of the frequency setting.

In one embodiment, it is possible to improve the precision or granularity of the time synchronization as now discussed. As N corresponds to a number of clock cycles, thereby an integer, it is hard to modify its value more often than about every second. However, if N is managed in a different way, it is possible to have fractional values for N. For example, it is possible during one second period to shift between successive adjustments, between $N_1$ and $N_1+1$ cycles. This means that in average, the device makes adjustments every $N_1+0.5$ cycles during each second. This allows more precise time synchronization, with finer corrections on the ADC modulator's clock, and might be useful in particular in the case of an XO oscillator. Although the example discussed above allows a precision of ½ N value, this solution is applicable for any fraction of N. For example, it is possible to implement a version that allows a precision of $1/16^{th}$ of N, or more.

Another variation of the embodiments discussed above is to vary the adjustment R. For example, it is possible to reduce its minimum value by working with a FPGA clock with higher frequency, or accept to use more than one value, i.e., a first value $R_1$ for a first time period $T_1$ and a second value $R_2$ for a second time period $T_2$. Using both the falling and rising edges of the FPGA main clock could also be an option.

Figure 10:
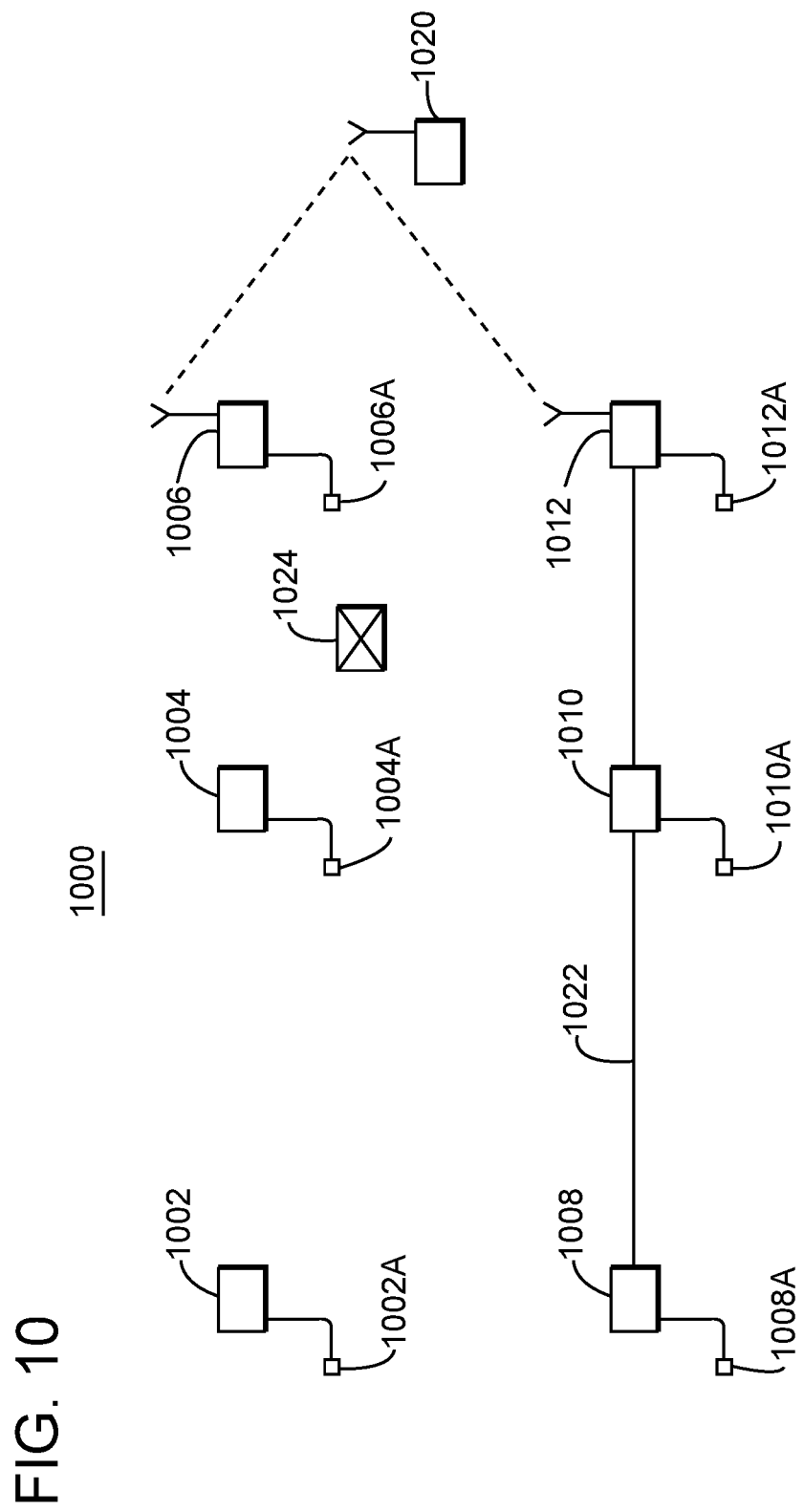
FIG. 10 illustrates a land seismic system having seismic data acquisition systems including clock adjustment modules.

An embodiment in which the XO oscillator is replaced by a VCXO oscillator is now discussed with regard to FIG. 7. The seismic data acquisition device 700, which may be a well seismic gauge configured to be deployed inside a well, includes a seismic sensor 701 (e.g., a geophone) and an ADC unit 704. The ADC unit 704 includes an oversampling ADC 703 of delta-sigma type and a VCXO 750 that generates a clock signal. The ADC unit 704 also includes a filter 715. For this embodiment, the VCXO 750 is designed to generate a desired frequency of 24.576 MHz, in the temperature range of 20 to 210° C. The seismic gauge 700 also includes a clock adjustment module 754, which may be similar to clock adjustment module 454 illustrated in FIG. 4. Clock adjustment module 754 may include a switch module 770 that is discussed later with regard to FIG. 10. Well gauge 700 may be shaped to fit inside of a well, for example, having a bullet shape. A cable 717 connects the well gauge 700 to a central unit 718. Central unit 718 may be located at the surface and it is configured to receive digital seismic data from well gauge 700.

Well gauge 700 is shown in more detail in FIG. 8. Above a certain temperature, depending on each component of the ADC unit 800, its aging, and other factors, a nominal frequency of the VCXO 850 is known to deviate too much, so that it is no more possible to have it generate the signal with the desired frequency.

Thus, the well gauge 800, according to the embodiment of FIG. 8, includes a switch module 870, which activates the clock adjustment module 854, for adjusting the clock signal 852 as necessary. VCXO 850 has a driving unit 851 that receives the time reference signal 813 from the time reference unit 811. All others modules and units in FIG. 8 are similar to those illustrated in FIG. 4.

Switch module 870 is configured to measure or receive a control voltage Vc of the VCXO and compare it with a threshold voltage $V_{co}$. If the control voltage Vc is smaller than the threshold voltage $V_{co}$, that means that the VCXO is generating the desired frequency and the clock adjustment module 854 is turned off. However, if the control voltage $V_c$ is larger than the threshold voltage Vco, the switch module 870 activates the clock adjustment module 854 to calculate the number of periods N and to apply the adjustment R at the end of N. Note that according to this embodiment, if the $V_c$ is smaller than the threshold, no adjustment R is applied.

However, in another embodiment, the switch 870 may be omitted and the clock adjustment module 854 may be left to continuously calculate N and apply the adjustment R even if the control voltage $V_c$ is larger than the threshold.

Modulation frequency of a VCXO increases with temperature, but this has also a direct influence on its control voltage, which decreases. In one embodiment, a 20% threshold is chosen, under which the resetting of the VCXO is relevant.

The use of the control voltage $V_c$ as the parameter to be monitored for applying the adjustment R has another advantage as the control voltage takes into account, not only the temperature shifts of VCXO, but also other factors, in particular its aging. In one embodiment, it is possible to consider another parameter for determining when to apply the adjustment R. For example, instead of $V_c$ it is possible to monitor the ambient temperature.

A specific example for a well gauge designed to be deployed in a well is now discussed. Consider that the desired frequency $f_{VCXO}$ is 24.576 MHz. At low temperatures, (typically less than 200° C.), the VCXO is driven by unit 851 and it generates a clock signal with the desired frequency, i.e., 24.576 MHz, and the ADC is provided with a signal having frequency $f_{ADC}$=1.024 MHz.

However, at high temperature, the switch module 870 switches on the clock adjustment module 854, and the VCXO is time synchronized for delivering a signal with frequency $f'_{VCXO}$ (which is larger than desired $f_{VCXO}$). If D=24, N=256 and R=1/$f_{VCXO}$, then the result of time synchronizing the VCXO with the clock adjustment module 854 results in the average time synchronization discussed above with regard to FIGS. 4 and 6, which can be mathematically written as:

$$ND/f'_{VXCO} + R = ND/f_{VXCO}$$

This results in $f'_{VCXO}$=[1+1/(D·R)]·$f_{VCXO}$, i.e., $f'_{VCXO}$=$f_{VCXO}$+163 ppm and $f_{ADC}$ is 1.024 MHz in average over the N periods.

Those skilled in the art would understand that the embodiments discussed above may be applied to other oscillators, continuously or only when a certain parameter (e.g., voltage) is larger than a threshold.

Figure 9:
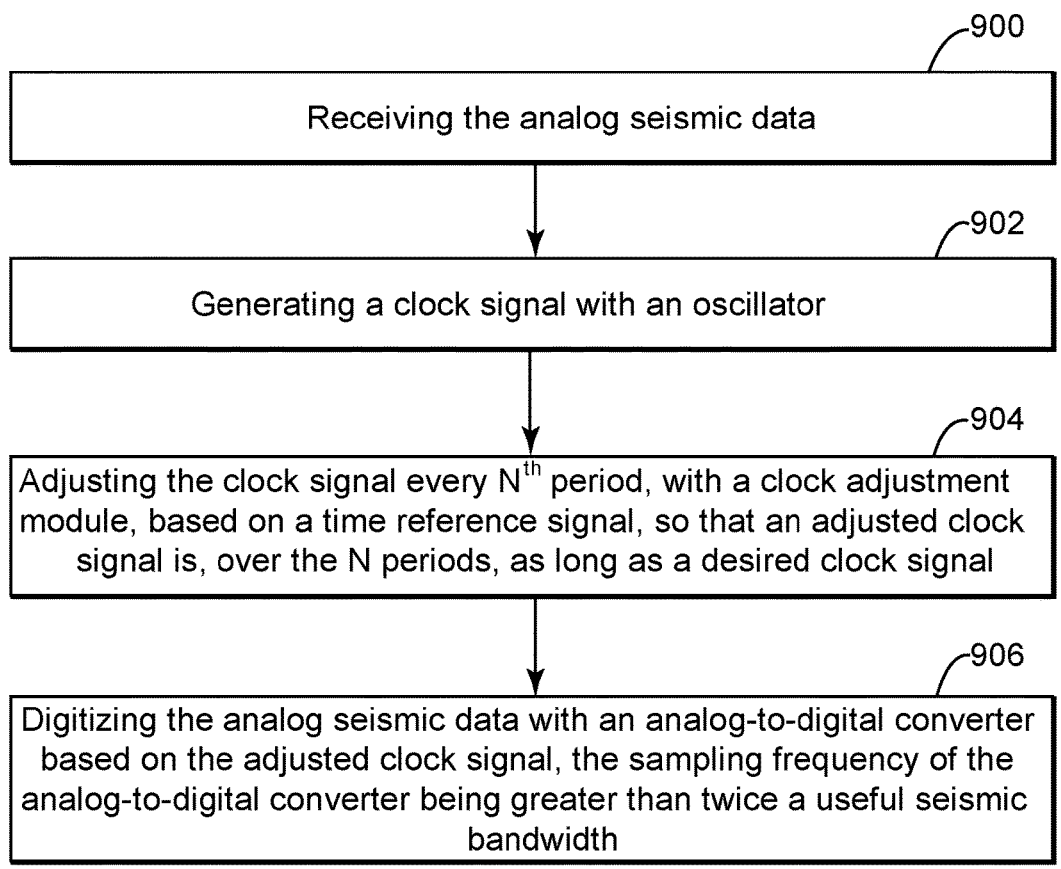
FIG. 9 is a flow chart of a method for adjusting a clock signal every $N^{th}$ period.

A method for digitizing recorded seismic data is now discussed with regard to FIG. 9. The method includes a step 900 of receiving the analog seismic data, a step 902 of generating a clock signal with an oscillator, a step 904 of adjusting the clock signal every $N^{th}$ period, with a clock adjustment module, based on a time reference signal, so that an adjusted clock signal is, over the N periods, as long as a desired clock signal, and a step 906 of digitizing the analog seismic data with an analog-to-digital convertor based on the adjusted clock signal, a sampling frequency of the analog-to-digital converter being greater than twice a useful seismic bandwidth.

The seismic data acquisition devices discussed above may be deployed, as illustrated in FIG. 10, over land for recording seismic data. In one embodiment, devices 1002, 1004 and 1006 are configured to communicate in a wireless manner among themselves and with a central unit 1020. In another embodiment, devices 1008, 1010 and 1012 are wired to each other with cables 1022 for transmitting the recorded seismic data. In one embodiment, wired and wireless devices may be both deployed for collecting the seismic data. Each such device includes a clock adjustment module as discussed above. These devices are connected to corresponding seismic sensors 1002A to 1012A, respectively. More than one seismic sensor may be attached to such device. The sensors are analog sensors, e.g., geophones, hydrophones, accelerators, etc. that record analog seismic data. The devices digitize the data as discussed above after which they may send the digitized data to the central unit 1020. In one embodiment, a harvester (vehicle, vessel or aircraft device) 1024 passes next to each device for collecting the seismic data.

Figure 11:
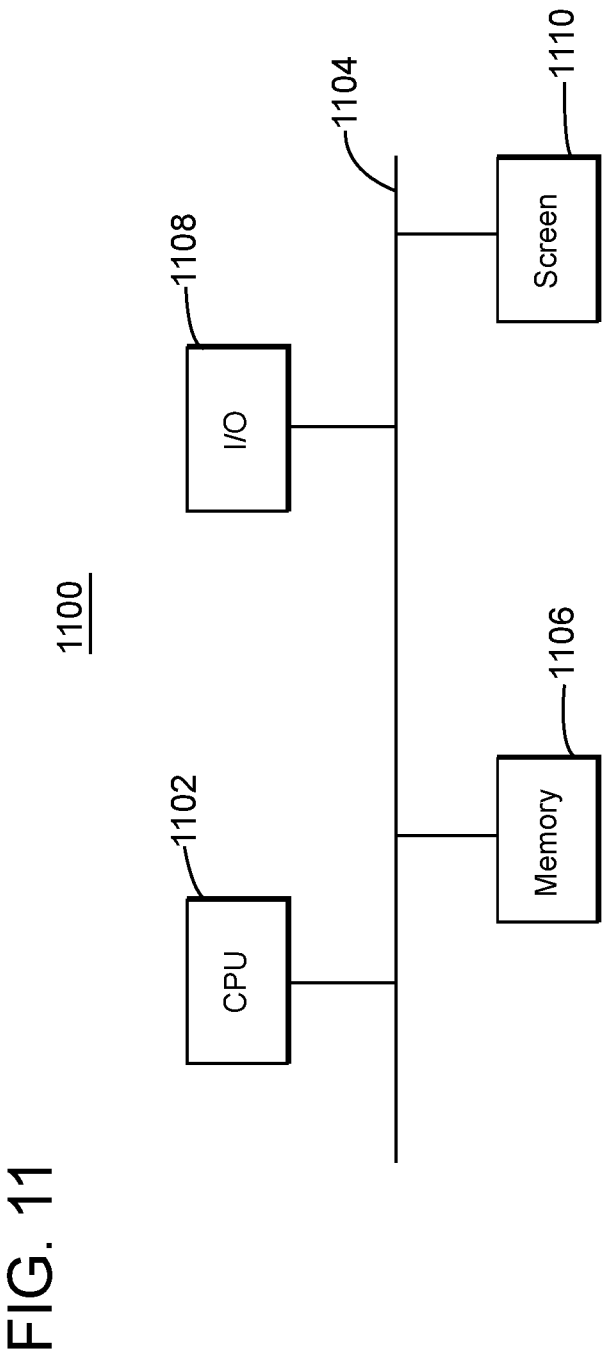
FIG. 11 is a schematic diagram of a computing device that implements the method discussed above.

An exemplary computing device that implements the above discussed method is illustrated in FIG. 11. The same computing device may be programmed to act as an ADC module, or to be part of the ADC module. The computing device 1100 includes a processor 1102 that is connected through a bus 1104 to a storage device 1106. Computing device 1100 may also include an input/output interface 1108 through which data can be exchanged with the processor and/or storage device. For example, a keyboard, mouse or other device may be connected to the input/output interface 1108 to send commands to the processor and/or to collect data stored in storage device or to provide data necessary to the processor. In one application, the computing device interacts with a GPS system for receiving timing and/or position information. In another application, the processor calculates the adjustment R as previously discussed. Also, the processor may be used to digitize, for example, seismic data collected during the seismic survey. Results of this or another algorithm may be visualized on a screen 1110.

The disclosed exemplary embodiments provide a seismic data acquisition system and a method for digitizing seismic data. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A data acquisition device comprising:
   an oscillator that generates a clock signal;
   a clock adjustment module that receives a time reference signal and the clock signal and outputs an adjusted clock signal having a frequency measured in Hz; and
   an analog-to-digital convertor configured to transform analog data into digital data having a sampling rate ($F_{DATA}$), based on the adjusted clock signal,
   wherein a sampling frequency ($f_{ADC}$) of the analog-to-digital convertor is selected to be at least twice the sampling rate ($F_{DATA}$),
   wherein the clock adjustment module is configured to adjust the clock signal with an adjustment R every $N^{th}$ period to obtain the adjusted clock signal, so that the adjusted clock signal is, over the N periods, as long as a desired clock signal, the desired clock signal having a frequency ($K \times f_{REF}$) that is a multiple of a frequency ($f_{REF}$) of the time reference signal, and
   wherein a frequency ($F_{xo}$/D) of the clock signal divided by a divisor (D) is differing from the frequency ($K \times f_{REF}$) of the desired clock signal with more than the sampling rate ($F_{DATA}$).

2. The device of claim 1, wherein the sampling rate ($F_{DATA}$) is selected based on a useful bandwidth (BW) of a frequency of interest of the analog data and also based on the adjusted clock signal.

3. The device of claim 1, wherein the clock adjustment module calculates periodically a new value for N.

4. The device of claim 1, wherein the clock adjustment module lengthens or shortens the $N^{th}$ period of the clock signal with a given value.

5. The device of claim 4, wherein the given value is inversely proportional with the clock signal.

6. The device of claim 1, further comprising:
a filter configured to remove noise generated by the adjustment of the clock signal out of a useful bandwidth.

7. The device of claim 1, further comprising:
a time reference module configured to generate the time reference signal.

8. The device of claim 1, wherein the oscillator is a voltage controlled crystal oscillator.

9. The device of claim 1, further comprising:
a switch module connected to the clock adjustment module and configured to measure a parameter of the oscillator, and to switch on or off the clock adjustment module depending on whether the parameter is larger or not than a given threshold.

10. The device of claim 9, wherein the parameter is a control voltage of the oscillator.

11. The device of claim 1, wherein the data are seismic data and further comprising:
a seismic sensor configured to acquire the seismic data.

12. The device of claim 1, wherein the clock signal generated by the oscillator (450) is differing from the desired clock signal ($K \times F_{REF}$) with more than 160 ppm.

13. The device of claim 1, wherein N is larger than 100 and smaller than 300.

14. The device of claim 1, wherein the clock signal is adjusted with different values at the $N^{th}$ period and the $x \cdot N^{th}$ period, with x being an integer larger than 1.

15. The device of claim 1, wherein the sampling frequency of the analog-to-digital convertor is greater than 32 times the sampling rate ($F_{DATA}$).

16. A seismic data acquisition device comprising:
an oscillator that generates a clock signal;
a clock adjustment module that receives a time reference signal and the clock signal and outputs an adjusted clock signal having a frequency measured in Hz; and
an analog-to-digital convertor configured to transform analog seismic data into digital data at a data sampling rate ($F_{DATA}$) adapted for seismic data, based on the adjusted clock signal, the sampling frequency of the analog-to-digital converter being greater than twice the data sampling rate,
wherein the clock adjustment module increases or decreases the $N^{th}$ period of the clock signal with an adjustment R to obtain the adjusted clock signal so that the adjusted clock signal is, over the N periods, as long as a desired clock signal, the desired clock signal having a frequency ($K \times f_{REF}$) that is a multiple of a frequency ($f_{REF}$) of the time reference signal and synchronized therewith, and
wherein the clock signal generated by the oscillator is differing from the desired clock signal with more than the sampling rate ($F_{DATA}$).

17. The device of claim 16, wherein the analog-to-digital convertor is an oversampling ADC.

18. The device of claim 17, wherein N is larger than 100 to have a shift from the desired clock signal smaller than 400 parts per million and N is smaller than 300 to prevent aliasing.

19. A method for digitizing analog seismic data with a desired clock signal, the method comprising:
receiving the analog seismic data;
generating a clock signal, differing from said desired clock signal, with an oscillator;
adjusting with an adjustment R the clock signal every $N^{th}$ period to obtain an adjusted clock signal, with a clock adjustment module, so that the adjusted clock signal is, over the N periods, as long as a desired clock signal, wherein the adjusted clock signal has a frequency measured in Hz; and
digitizing the analog seismic data with an analog-to-digital convertor based on the adjusted clock signal, a sampling frequency of the analog-to-digital converter being greater than twice a useful seismic bandwidth.

20. The method of claim 19, wherein the desired clock signal is time synchronized with the reference time signal at each cycle.

* * * * *